United States Patent [19]

Freimark et al.

[11] 4,157,547

[45] Jun. 5, 1979

[54] SPLITTER FOR ANTENNA FOR AM-FM, CB AND METHOD OF CONVERSION

[75] Inventors: Ronald J. Freimark, Chagrin Falls; Robert E. Isaacson, Streetsboro, both of Ohio

[73] Assignee: Tenna Corporation, Cleveland, Ohio

[21] Appl. No.: 776,244

[22] Filed: Mar. 10, 1977

[51] Int. Cl.² .................. H03H 7/10; H01Q 1/34
[52] U.S. Cl. ..................... 343/180; 343/858
[58] Field of Search ............. 325/15, 20, 25, 381; 343/715, 745, 749, 750, 850, 858, 860, 180, 176

[56] References Cited

U.S. PATENT DOCUMENTS

| 3,582,791 | 6/1971 | Slavin | 325/381 |
| 3,671,972 | 6/1972 | Spilsbury | 343/750 |
| 3,725,942 | 4/1973 | Ukmar | 343/715 |
| 3,824,599 | 7/1974 | Haswell | 343/858 |
| 3,973,202 | 8/1976 | Gardner | 343/715 |
| 4,037,177 | 7/1977 | Tyrey | 343/858 |
| 4,038,661 | 7/1977 | Nolte | 343/750 |
| 4,041,498 | 8/1977 | Freimark | 343/749 |

Primary Examiner—Robert L. Griffin
Assistant Examiner—Michael A. Masinick
Attorney, Agent, or Firm—Watts, Hoffmann, Fisher & Heinke Co.

[57] ABSTRACT

An electrical circuit and method for providing electrical coupling from a CB antenna to both a CB (Citizen's Band—Class D) transceiver and to an AM-FM receiver (amplitude modulation—frequency modulation) whereby only a single antenna need be used for both CB transceiver and AM-FM receiver.

13 Claims, 5 Drawing Figures

*Conventional C.B. System*

*Conventional AM-FM System*

SPLITTER FOR ANTENNA FOR AM-FM, CB AND METHOD OF CONVERSION

SUMMARY—BACKGROUND OF THE INVENTION

The present invention relates to a device for coupling a CB antenna to both a CB transceiver and to an AM-FM receiver.

In mobile units such as automotive vehicles it is common to have an AM-FM radio and a CB transmitter-receiver(transceiver). In such units it is common practice to provide one antenna for the AM-FM radio and a second separate antenna for the CB transceiver. One problem has been that a CB antenna system, including connecting coaxial cable, is normally unsuitable for the AM-FM receiver and vice versa. In the present invention a splitter circuit has been provided in which a CB antenna can be used with both a CB transceiver and an AM-FM receiver.

The frequency range for Class D CB operation is between 26.965 and 27,405 40 channel band MHz while FM is 88–108 MHz and AM is 540–1600 KC. In the present invention the CB antenna is connected to a coaxial lead line, having an impedance usually utilized for the AM-FM receiver. That coaxial lead line is connected to the AM-FM receive via a parallel LC trap, having a resonant frequency of 27.2 MHz. The parallel trap provides a high impedance to CB signals and low impedance to AM-FM signals. The coaxial lead line is also connected to the CB transceiver via a series LC circuit, which will not be resonant at 27.2 MHz, but which has an inductance which offers a high impedance to FM signals and a capacitance which offers a high impedance to AM. The LC circuit will have a net capacitive or inductive reactance for a purpose to be described. Now the series, non-resonant, circuit offers a low impedance to CB signals and a high impedance to AM-FM signals, with a net reactive component. The net reactive component is selected to have a magnitude which when taken with the rest of the system provides characteristic impedance resulting in matching. In addition the series circuit is connected to the transceiver via a coaxial line, having an impedance usually used for the CB lead line. Thus the CB antenna system is modified to minimize what would otherwise be a significant impedance mismatch between CB antenna and the coaxial lead line. The result is a total CB and AM-FM system which can function with good performance characteristics while utilizing only a single, CB antenna. It is common to have the CB antenna which is resonant at a frequency midway in the CB range. In the present invention, however, the antenna may be slightly detuned to compensate for the other components of the combined system.

Therefore, it is an object of the present invention to provide a CB and AM-FM system and/or method utilizing a single, CB antenna.

It is another object to provide such a system and/or method in which a conventional AM-FM coaxial lead line can be used from the CB antenna.

It is another object to provide such a system and/or method in which a tuned resonant circuit is utilized to block CB signals from the AM-FM receiver and a series, non-resonant LC circuit is used to block AM-FM signals from the CB transceiver.

It is another object to provide such a system and/or method in which the series non-resonant LC circuit has a net reactive component of a preselected magnitude to compensate for lead line mismatch to the CB system.

It is another object to provide such a system and/or method in which the CB antenna may be slightly detuned to compensate for other components of the combined system.

It is another object of the present invention to provide an improved combined CB and AM-FM system and a system for implementing the same.

Other objects, features and advantages of the present invention will become apparent from the subsequent description and the appended claims, taken in conjunction with the accompanying drawings, in which:

Figure 1:
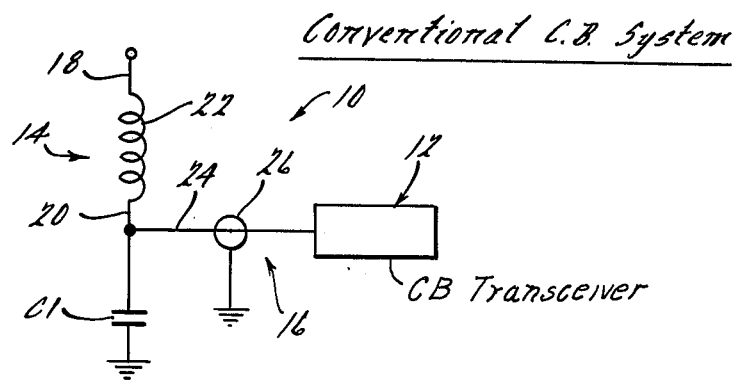
FIG. 1 is an electrical circuit diagram depicting a conventional CB system.

Looking now to FIG. 1 a conventional (Class D) CB system 10 is shown and includes a transmitter-receiver (transceiver) 12 connected to an antenna 14 via a coaxial cable 16. As previously noted, the present invention is of special significance for mobile applications and will be described in conjunction therewith although it should be understood that the practice of this invention need not be so limited. The antenna 14 is of a type used in mobile application and includes a tip 18 and a mast 20 connected by an intermediately located load coil 22. The load coil 22 provides the known function of permitting use of an antenna of reduced height while still providing an effective length of ¼ wave.

The coaxial cable 16 has conventionally been of a type designated as RG58U which has a known characteristic impedance of 50 ohms. In FIG. 1, the coaxial cable 16 is shown to have a center conductor 24 connected from the transceiver 12 to the antenna 20 and an outer coaxial shield 26 which is connected to ground, which in a mobile application could be the vehicle body. The antenna 14 is also connected to ground via a capacitor C1.

The antenna 14 is constructed such as to be resonant at the midrange of the CB band while at the same time having as low an SWR (Standing Wave Ratio) as possible, i.e. an SWR of one is ideal. It has been found that the addition of capacitor C1 of a selected value will permit the attainment of SWR at unity while having little effect on the tuning of the antenna. Tuning of the antenna 14 is most readily accomplished by varying the load coil 22 and/or the height of tip 18. Note that in other systems an inductance may be utilized in place of C1 where inductive reactance is required instead of capacitive reactance.

The coaxial lead cable 24 has an impedance along with that of the antenna 14 to provide a good match with the internal impedance of transceiver 12; this is provided in order to optimize power transfer.

Figure 2:
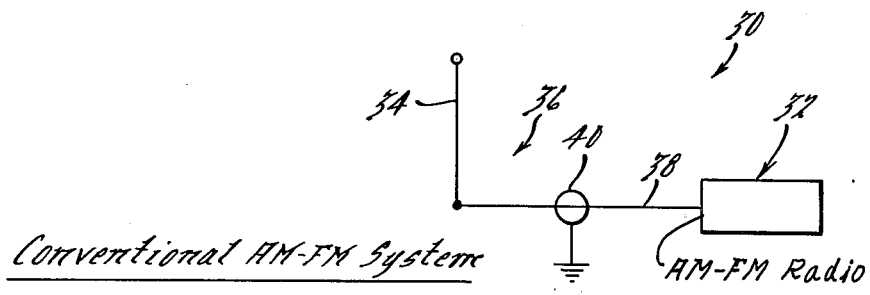
FIG. 2 is an electrical circuit diagram depicting a conventional AM-FM system.

Looking now to FIG. 2, a typical AM-FM receiver system 30 is shown and includes an AM-FM receiver 32 and a receiving antenna 34 electrically connected via a coaxial lead cable 36. The cable 36 has a center conductor 38 connected between antenna 34 and the receiver 32 and a coaxial shield 40 connected to ground i.e. vehicle body. The impedance of the coaxial cable and input to receiver 32 is provided to have a good match with that of the antenna 34 to optimize power transfer. The cable 38 conventionally has been of a type designated as RG62U which has a known characteristic impedance of 93 ohms.

In considering a combined system with only one antenna and one coaxial lead cable a single connection of CB transceiver 12 to cable 36 or AM-FM receiver 32 to cable 16 could not be successfully made.

Let us look to the latter possibility noted above, i.e. simply connecting AM-FM receiver 32 in the CB system 10 at cable 16. The FM signal would be seriously attenuated through capacitor C1. In addition the capacitance of the coaxial cable, RG58U, is substantially higher than that of the AM-FM cable RG62U, i.e. 21 pf per unit of length versus 9.5 pf per unit of length. The capacitor C1 would provide a high reactance to the relatively low frequency AM signal and, along with the cable capacitance, would seriously effect the capability of the input circuit for the AM signal to be properly tuned. In addition to the above the CB system cable 16 and antenna 14 would provide a serious impedance mismatch with the AM-FM receiver 32 resulting in serious degradation of signal.

Let up look at the problems of the alternate situation in which the CB transceiver 12 would be connected to the AM-FM system 30 at cable 36. The effective length of antenna 34 would be grossly inadequate (assuming the normal car radio length antenna is less than three feet) such that CB transmission strength would be inadequate for practical purposes. In addition the cable 36 would provide serious impedance mismatch problems with transceiver 12, i.e. RG62U has a characteristic immpedance of 93 ohms in contrast to the CB transceiver 12 which has a nominal output impedance of 50 ohms.

The above noted problems have been effectively solved or significantly mitigated with a combined system 50 (FIG. 3) such that commercially practical results have been attained within the limits of Class D, CB operation.

Figure 3:
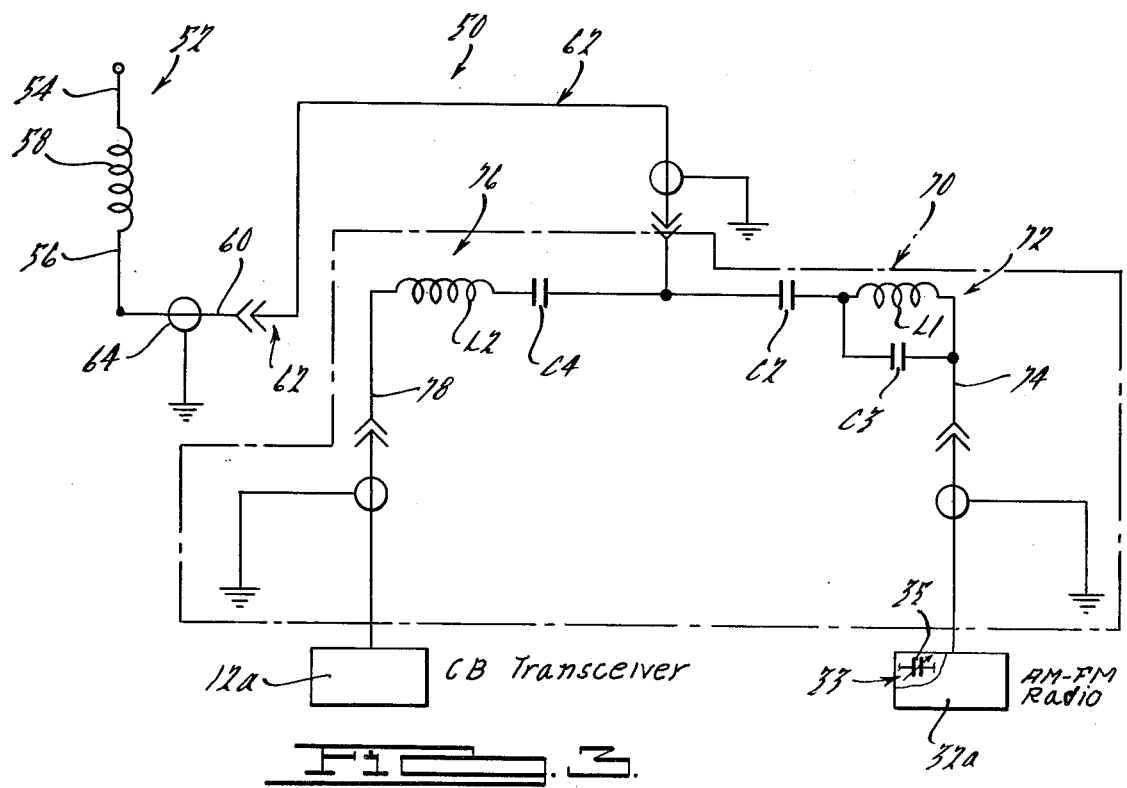
FIG. 3 is an electrical circuit diagram depicting the circuit of the present invention adapting a conventional CB antenna for use with a combined CB and AM-FM system.

Looking now to FIG. 3, a combined AM-FM and CB system 50 is shown and includes a CB antenna 52. Antenna 52 has a tip 54 and a mast 56 connected by an intermediately located loading coil 58. The loading coil 58 provides the necessary effective increase in length whereby the effective length of antenna 52 is approximately the desired one quarter (¼) wave length.

Note that the entire length of antenna 52 including load coil 58 is effective for CB and is also effective for AM. With FM however, because load coil 58 provides a high impedance to FM, the tip 54 is essentially of little real effect and only that portion below the load coil 58, i.e. mast 56, is effective for FM. Thus the mast 56 is selected to provide the desired length for FM signals, i.e. a one quarter wave length or approximately 31 inches. Note that the mast length is preferably in a range of 20-34 inches but can be within a range of 12-38 inches. Note that for AM, a longer antenna is desirable, i.e. to approach one quarter wave; here the entire length of antenna 52 is effective.

Antenna 52 is electrically connected to a center conductor 60 of a coaxial lead cable 62 which has a coaxial outer shield 64 connected to ground. Note that the cable 62 is of the type RG62U used for the AM-FM system 30.

Coaxial cable RG62U is connected to a splitter circuit 70 which connects to both an AM-FM receiver 32a and to a CB transceiver 12a.

The center conductor 60 is connected to th AM-FM receiver 32a via a series circuit including a capacitor C2 and a parallel resonant trap 72. The trap 72 includes an inductance L1 capacitor C3 connected in parallel and having a resonant frequency near the midrange of the CB (Class D) band, i.e. 27.2 MHz. The output from the trap 72 is connected to the input of receiver 32a via an additional length 74 of RG62U cable, i.e. conventionally used, as in AM-FM system 30.

The trap 72 provides a very high impedance to CB signals in the CB (Class D) frequency range. The capacitor C3, however, provides a low impedance path for the FM signals (significantly higher in frequency than the CB) while the coil or inductance L1 provides a low impedance path for the AM signals. In AM receivers it is common to have a tuned circuit 33 at the input with the tuning being peaked by an internal trimmer capacitor 35. The capacitor C2 provides a low impedance for the FM signal and acts as a padder capacitor for the AM portion of the receiver 32a to assist in internal AM tuning. This is required because of the significant difference in capacity of the CB antenna 52 as compared to antenna 34 for AM-FM system 30 whereby the range capability of the internal trimmer capacitor for the AM portion of receiver 32a could be exceeded.

With the height of mast 56 to provide the desired length for FM reception, i.e. approximately 29 inches, the CB antenna 52 will not appreciably affect the AM-FM reception and the receiver 32a will essentially have a good impedance match by virtue of cables 60 and 74 being the RG62U.

The center conductor 60 is connected to the CB transceiver 12a via a series circuit which includes a series, non-resonant circuit 76 and a coaxial cable 78. The series non-resonant circuit 76 includes a capacitor C4 and a coil or inductance L2 which are out of series resonance at the midrange of the CB band, i.e. 27.2 MHz. The CB system has a characteristic impedance different from the AM-FM systems and hence cable 62 will provide a significant impedance mismatch and will result in a high, undesirable SWR. In the present invention a preselected desired length of cable 62 is used and the antenna 52 is detuned slightly as necessary. The SWR and desired impedance can now be brought to the desired value, i.e. unity and 50 ohms, respectively, by inserting a net amount of reactance, i.e. capacitive or inductive, sufficient to return the system to resonance. This is done via the series non-resonant circuit 76. Here the values of C4 and L2 can be selected to be of a magnitude to provide the noted high impedance to block AM and FM and to provide the net inductive or capacitive reactance desired to bring the SWR at or near unity and the total characteristic impedance (Zo) at 50 ohms. Note that the detuning of antenna 52 can be accomplished most conveniently by varying the length of tip 54. Thus the circuit 76 provides a low impedance path for the (Class D) CB signals while the coil L2 provides a high impedance to the FM signals and capacitor C4 provides a high impedance for the AM signals. Thus series circuit 76 effectively blocks AM or FM signals from the transceiver 12a.

The final connecting cable 78 is a coaxial cable having a center conductor and grounded shield and is of the RG58U type which is that typically used for systems such as CB system 10.

Note in the combined system 50, the capacitor C1 (or corresponding inductance for other systems) of the CB system 10 has been eliminated to prevent degradation of the FM signals. This would normally adversely affect the SWR of the CB portion of the system. This loss in capacitance, however, is compensated for by the use of the AM-FM type line 62 which has a lower shunt capacitance than the CB type line, i.e. RG62U versus RG58U, the detuning, as necessary, of antenna 52 and the non-resonant circuit 76.

Splitter circuit 70 is preferably located proximate to transceiver 12a and AM-FM receiver 32a whereby only a single cable 62 is used for the bulk of the distance from antenna 52 and relatively short lengths of cables 74 and 78 are required.

Note that the center of the (Class D) CB band is 27.2 MHz. In order to compensate for the loss of capacitor C1 and change in impedance presented by the AM-FM type (RG62U) cable 62 the antenna 52 must be slightly detuned from resonance at the midrange, i.e. 27.2 MHz. This can be done either by varying the length of tip 54 or modifying load coil 58 and as noted is most conveniently performed on tip 54. As noted, the series circuit 76 is not tuned to resonance at midrange (27.2 MHz) and at the same time the length of coaxial line 62 is selectively varied. The combination of above changes presents to the transceiver 12a a characteristic impedance very close to the 50 ohm characteristic impedance for a cable type RG58U for which it was designed. At the same time the SWR of the CB portion of the system is not significantly degraded. Note that while 50 ohm and 93 ohm cables are discussed, the same steps as noted above could be applied to cables having different impedances.

Figure 4:
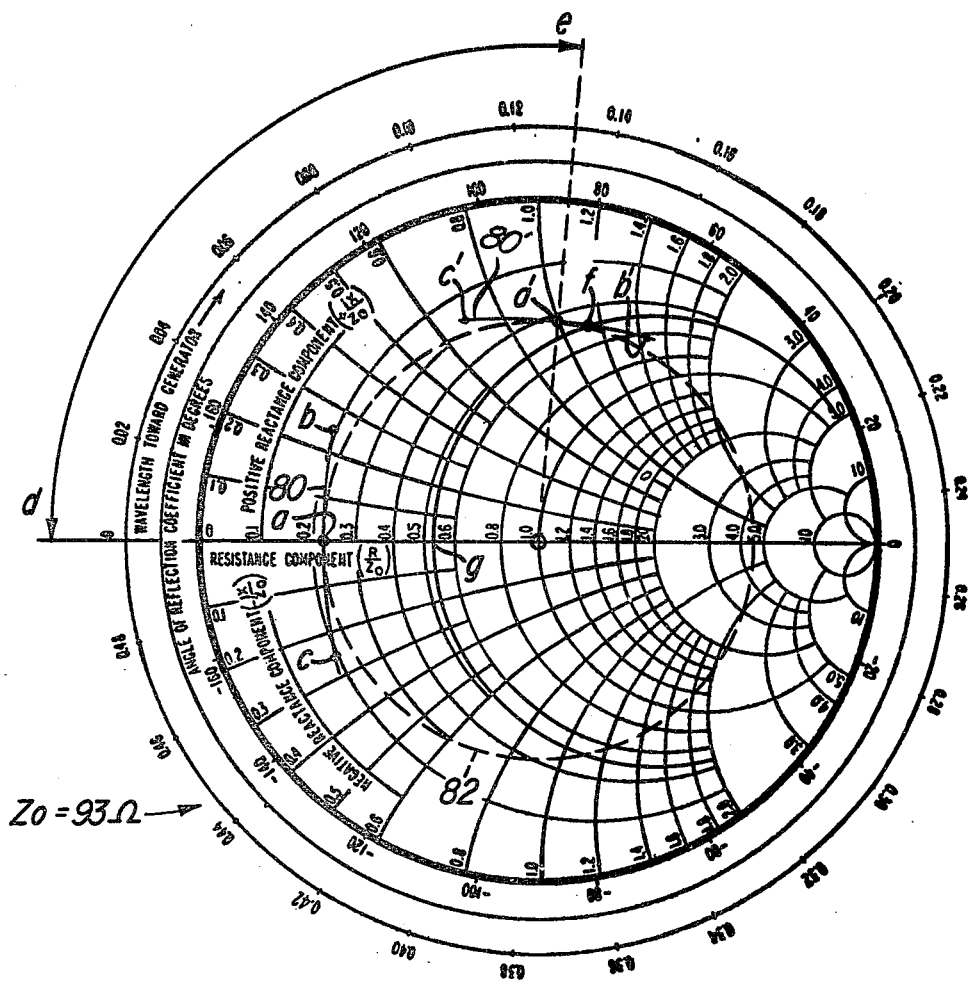
FIG. 4 is a representation of a Smith chart demonstrating the method of tuning the CB system to the desired impedance and to have the desired SWR.

The method of arriving at the necessary net impedance from L2 and C4 can be seen by application of a conventional Smith chart (see FIG. 4). Looking to FIG. 4, the variation in impedance of antenna 52 by varying the tip length 54 can be seen by line 80 which can be determined by securing the impedance at three different lengths represented by the three points a, b and c. Point "a" represents a resonant condition with no reactance component while point "b" represents a shorter antenna tip length with a net inductive reactance and point "c" represents a longer antenna tip length with a net capacitive reactance. Knowing the length of cable 62 the curve 'cab' is transposed clockwise, i.e. in a direction of "wavelength toward generator" a distance along the dotted circle 82 corresponding to the cable length in wavelengths. In the example shown the cable length corresponds to approximately 0.13 λ i.e. the distance from point d to point e. The result is line 80' and points c'a'b' transformed as shown.

As noted it is desired to provide an impedance of approximately 50 ohms. Since the cable 62 has an impedance of 93 ohms, it is required that a given amount of reactance be added. The chart of FIG. 4 is plotted for a characteristic impedance (Zo) of 93 ohms. Therefore, if the 0.53 circle is used it will represent 0.53 times Zo (93 ohms) or, the desired 50 ohms and this circle intersects the line 80' approximately at a point 'f'. Now using that tip length it is only necessary to add a reactance opposite to that represented by line from point f to the 0.53 intercept 'g'. In the example shown in FIG. 4, the fg distance indicates an excess of inductive reactance and a corresponding amount of excess capacitive reactance is required to offset it. Thus the value of capacitance C4 is selected to provide a net excess of capacitive reactance (at 27.2 MHz) over the inductive reactance provided by L2 whereby a 50 ohm impedance is seen at cable 78 and at transceiver 12a and with an SWR of near unity. Note that the chart of FIG. 4 was plotted as Zo=93 ohms; now since the impedance of cable 78 and of the connected system including antenna 52, cable 62 and series L-C circuit 76 is at the desired 50 ohms, the SWR of the system can be determined by replotting on a Smith chart for 50 ohms, i.e. the center of the chart or "1.0" would be at 50 ohms. Thus the SWR would be unity at 27.2 MHz. Some slight variation from unity, of course, would be present for frequencies within the CB range on opposite sides of the midrange, 27.2 MHz. Note that the addition of excess reactance via the series L-C circuit 76 performs the function of the capacitor C1 (or inductance) for the conventional CB system 10. The above process can be applied evenly effectively if line 62 had an impedance other than 93 ohms, i.e. a standard 125 ohm cable, etc.

Figure 5:
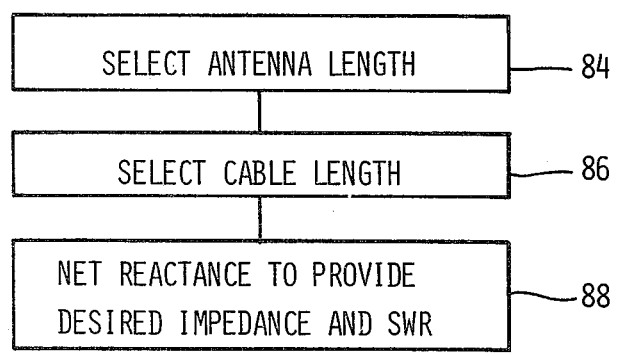
FIG. 5 is a block diagram depicting the steps of implementing the system of the present invention.

Looking now to FIG. 5, a block diagram is shown indicating the steps of implementing the present invention.

Thus block 84 indicates the step of adjusting the length of antenna 52 via variation in tip length 54. Block 86 depicts the step of selection of the length of cable 62; note that cable 62 should be of a length at least sufficient to extend from the antenna 52 to the general location of the transceiver 12a and/or AM-FM receiver 32a and/or the splitter circuit 70. Thus the minimum length of cable 62 will to some extent be predetermined and its length over that minimum can be varied for tuning purposes as noted. Finally the magnitude of excess reactance of the L-C circuit 76 can be determined and supplied (see block 88). While the above steps have been shown and described in a set order, it should be understood that this order can be varied and the ultimate end result still attained.

The result is a combined system 50 in which a conventional AM-FM receiver and a conventional CB transceiver can function in an acceptable manner utilizing a single antenna of the CB type and a single coaxial lead line from the antenna 52 to the splitter 70. The splitter 70 then can be incorporated in or located proximate to the AM-FM receiver 32a and/or the transceiver 12a.

While it will be apparent that the preferred embodiments of the invention disclosed are well calculated to fulfill the objects above stated, it will be appreciated that the invention is susceptible to modification, variation and change without departing from the proper scope or fair meaning of the subjoined claims.

What is claimed is:

1. In a system including a CB transceiver having a receiving CB input circuit and a transmitting CB output circuit for receiving an transmitting CB signals within a CB frequency range with the CB input and output circuits having a first impedance, and an AM/FM receiver having an AM input circuit having second input impedance for receiving AM signals within an AM frequency range and an FM input circuit having a third input impedance for receiving FM signals within an FM frequency range, the improvement comprising: an antenna structure having an effective length approximately equal to ¼ wavelength at approximately the center of the CB frequency range, and including a loading coil, said antenna structure being effective for receiving the FM signals over the FM frequency range, said antenna structure having an effective length for receiving the AM signals over the AM frequency range, splitter means for electrically connecting said antenna structure with the CB transceiver input and output circuits and the AM and FM input circuits and comprising splitter circuit means having a common splitter circuit for connectng all signals to and from said antenna structure and splitter AM/FM output circuit means for transmitting AM and FM signals to the AM and FM input circuits and substantially rejecting the CB signals and splitter CB circuit means for transmitting CB signals beween said antenna structure and the CB input and output circuits while substantially rejecting AM and FM signals, a first single connecting coaxial cable having one end electrically connected to said antenna structure and coil and an opposite end electrically connected to said common circuit, a second coaxial cable connected between said splitter AM/FM output circuit and the AM/FM input circuits, and a third coaxial cable connected between said splitter CB circuit and the CB input and output circuits, said first coaxial cable having a characteristic impedance providing an impedance match with the AM and FM input circuits and an impedance mismatch with the CB transceiver input and output circuits, said second coaxial cable having a characteristic impedance providing an impedance match with the AM/FM input circuits, and said third coaxial cable having a characteristic impedance providing an impedance match with the CB input and output circuits, said splitter CB circuit means comprising CB reactive circuit means having a reactance for blocking AM and FM signals and transmitting CB signals and having a preselected net reactance, said net reactance selected in conjunction with the characteristic impedance and length of said first coaxial cable, said antenna structure and said third coaxial cable to provide substantially an impedance match with the CB transceiver input and output circuits.

2. The system of claim 1 with said net reactance in conjunction with the characteristic impedance and length of said first coaxial cable, said antenna structure and said third coaxial cable providing a standing wave ratio proximate unity.

3. The system of claim 1 with said CB reactive circuit means comprising a non-resonant series L-C circuit with the magnitudes of L and C selected to provide a high impedance to the FM and AM signals, respectively, and with the magnitudes of L and C providing said net reactance.

4. The system of claim 1 with said antenna structure being predeterminedly non-resonant generally at the center of the CB range and with said net reactance compensating for such non-resonance to provide the impedance match with the CB transceiver input and output circuits.

5. The system of claim 1 with said splitter AM-FM output circuit means comprising AM-FM reactive circuit means having a reactance for blocking CB signals and transmitting AM-FM signals.

6. The system of claim 5 with said AM-FM reactive circuit means comprising a parallel resonant L-C circuit being resonant generally at the center of the CB range and providing a high impedance to CB signals.

7. The system of claim 6 with the desired magnitude of said net reactance selected to occur generally at the center of the CB frequency range.

8. The system of claim 6 with the AM-FM receiver having an AM portion and an FM portion and with the AM portion having a tuned circuit with a trimmer capacitor for peak tuning and with the improvement further comprising a padder capacitor serially connected with said L-C circuit for compensating for the capacitance of said antenna structure whereby the range of tuning of the trimmer capacitor is extended.

9. In a system including a CB transceiver having a receiving CB input circuit and a transmitting CB output circuit for receiving and transmitting CB signals within a CB frequency range with the CB input and output circuits having a first impedance, and an AM/FM receiver having an AM input circuit having a second input impedance for receiving AM signals within an AM frequency range and an FM input circuit having a third input impedance for receiving FM signals within an FM frequency range, an antenna structure including a loading coil and having an effective length approximately equal to one quarter wave length at approximately the center of the CB frequency range and having a length portion effective for receiving the FM signals over the FM frequency range, the antenna structure having an effective length for receiving the AM signals over the AM frequency range, splitter means for electrically connecting the antenna structure with the CB transceiver input and output circuits and the AM and FM input circuits and comprising splitter circuit means having a common circuit for connecting all signals to and from the antenna structure and a splitter AM/FM output circuit for transmitting AM and FM signals to the AM and FM input circuits and substantially rejecting CB signals and a splitter CB circuit for transmitting CB signals between the antenna structure and the CB input and output circuits while substantially rejecting AM and FM signals, a first common connecting coaxial cable having one end electrically connected to the antenna structure and loading coil and an opposite end connected to the common circuit, a second coaxial cable connected between the splitter AM/FM output circuit and the AM/FM input circuits, and a third coaxial cable connected between the splitter CB circuit and the CB input and output circuits, the method comprising: providing a series L-C circuit in the splitter CB circuit and selecting the magnitudes of L and C to provide a high impedance to the FM and AM signals, respectively, and with the magnitudes of L and C providing a net reactance, determining the impedance of the antenna structure, and using the known characteristic impedance of the first common cable, selecting the height of the antenna structure, the length of the first common cable and the magnitude of the net reactance to provide an impedance match with the CB input and output circuits and a standing wave ratio approximately at unity.

10. In a system including a CB transceiver having a receiving CB input circuit and a transmitting CB output circuit for receiving and transmitting CB signals within a CB frequency range with the CB input and output circuits having a first impedance, and an AM-FM receiver having an AM input circuit having a second input impedance for receiving AM signals within an AM frequency range and an FM input circuit having a third input impedance for receiving FM signals within an FM frequency range, an antenna structure having a tip portion, a mast portion and a loading coil and having an effective length approximately equal to one quarter wave length at approximately the center of the CB frequency range, the mast portion having a length effective for receiving the FM signals over the FM frequency range, the antenna structure having an effective length for receiving the AM signals over the AM frequency range, splitter means for electrically connecting the antenna structure with the CB transceiver input and output circuits and the AM and FM input circuits and comprising splitter circuit means having a common circuit for connecting all signals to and from the antenna structure and a splitter AM-FM output circuit for transmitting AM and FM signals to the AM and FM input circuits and substantially rejecting CB signals and a splitter CB circuit for transmitting CB signals between the antenna structure and the CB input and output circuits while substantially rejecting AM and FM signals, a first common connecting coaxial cable having one end electrically connected to the antenna structure and an opposite end connected to the common circuit, a second coaxial cable connected between the splitter AM-FM output circuit and the AM-FM input circuits, and a third coaxial cable connected between the splitter CB circuit and the CB input and output circuits, the second comprising: providing the first common cable to have an impedance substantially matching the AM and FM input impedances while mismatching the impedance of the CB input and output circuits, providing the second cable to have an impedance substantially matching the AM and FM input impedances, providing the third cable to have an impedance substantially matching the CB impedance of the CB input and output circuits, providing a series L-C circuit in the splitter CB circuit and selecting the magnitudes of L and C to provide a high impedance to the FM and AM signals, respectively, and with the magnitudes of L and C providing a net reactance generally at the center of the CB frequency range, determining the impedance of the antenna structure and the characteristic impedance of the first common cable, and selecting the height of the antenna structure, the length of the first common cable and the magnitude of the net reactance to provide substantially at the center of the CB frequency range an impedance match with the CB input and output circuits and a standing wave ratio approximately at unity.

11. The method of claim 10 further comprising selecting the mast portion to have a length in the range of 12 to 38 inches, and selecting the effective length of the common antenna structure to be out of resonance at the center of the CB frequency range.

12. In a system including a radio having a receiving input circuit and a transmitting output circuit for receiving and transmitting signals within a first frequency range with first input and output circuits having a first impedance, and a second radio having a second receiving input circuit having a second input impedance for receiving second signals within a second frequency range, the improvement comprising: an antenna structure having an adjustable length and a loading coil for receiving signals at approximately the center of the first frequency range, said antenna structure being effective for receiving the second signals over the second frequency range, splitter means for electrically connecting said antenna structure with the first radio input and output circuits and the second input circuit and comprising first splitter circuit means having a common splitter circuit for connecting all signals to and from said antenna structure and second splitter circuit means for transmitting signals within the second frequency range between said antenna structure and the second receiving input circuit while substantially rejecting signals in the first frequency range, a first coaxial cable having one end electrically connected to said antenna structure and an opposite end electrically connected to said common splitter circuit, a second coaxial cable connected between said splitter circuit and the second receiving input circuit and a third coaxial cable connected between said splitter circuit and the first input and output circuits, said first coaxial cable having a characteristic impedance providing an impedance mismatch with the first input and output circuits, said splitter means further comprising reactive circuit means having a reactance for blocking the second signals and transmitting the first signals and having a preselected net reactance, said net reactance selected in conjunction with the characteristic impedance and length of said first coaxial cable, said antenna structure, and said third coaxial cable for providing substantially an impedance match with the first radio input and output circuits.

13. In an AM/FM receiver and CB transceiver combination: an antenna designed for CB transceiving having a loading coil; a first coaxial cable from the antenna, said first cable having an impedance designed for use with the AM/FM receiver; a parallel LC circuit connected between said first cable and an AM/FM receiver, resonant for CB frequency and thus of a high impedance to CB frequencies and of a low impedance for AM/FM frequencies; and a second coaxial cable connected to a CB transceiver and having an impedance designed for use with the CB transceiver; a series LC circuit connected between said first cable and said second cable, said series LC circuit being nonresonant for CB frequencies and thus of low impedance to CB frequency signals and having an inductance that provides a high impedance to FM frequency signals and having a capacitance that provides a high impedance to AM frequency signals; said series LC circuit having a net reactive component chosen to offset the impedance mismatch of the first cable with respect to the CB transceiver and of a magnitude that with the other circuit components matches the impedance of said second coaxial cable.

* * * * *

UNITED STATES PATENT AND TRADEMARK OFFICE
CERTIFICATE OF CORRECTION

PATENT NO. : 4,157,547

DATED : June 5, 1979

INVENTOR(S) : Ronald J. Freimark and Robert E. Isaacson

It is certified that error appears in the above–identified patent and that said Letters Patent are hereby corrected as shown below:

Column 3, line 28, "up" should be -- us --.

Column 6, line 57, "an" should be -- and --.

Column 9, line 22 (Claim 10), "second" should be -- method --.

Signed and Sealed this

Twenty-eighth Day of August 1979

[SEAL]

Attest:

LUTRELLE F. PARKER

Attesting Officer     Acting Commissioner of Patents and Trademarks